United States Patent [19]

Saeki

[11] Patent Number: 5,801,983
[45] Date of Patent: Sep. 1, 1998

[54] SEMICONDUCTOR MEMORY DEVICE HAVING MEMORY CELLS DESIGNED TO OFFSET BIT LINE PARASITIC CAPACITANCE

[75] Inventor: Takanori Saeki, Tokyo, Japan

[73] Assignee: NEC Corporation, Tokyo, Japan

[21] Appl. No.: 590,516

[22] Filed: Jan. 29, 1996

[30] Foreign Application Priority Data

Jan. 30, 1995 [JP] Japan ................................ 7-012257

[51] Int. Cl.$^6$ ................................................ G11C 11/24
[52] U.S. Cl. ........................ 365/149; 365/210; 365/63
[58] Field of Search ............................. 365/149, 210, 365/63, 72

[56] References Cited

U.S. PATENT DOCUMENTS

| | | | |
|---|---|---|---|
| 4,807,195 | 2/1989 | Busch et al. | 365/149 |
| 4,926,382 | 5/1990 | Sakui et al. | 365/210 |
| 5,305,252 | 4/1994 | Saeki . | |
| 5,341,326 | 8/1994 | Takase et al. | 365/149 |
| 5,359,566 | 10/1994 | Furuyama | 365/149 |
| 5,369,612 | 11/1994 | Furuyama | 365/149 |
| 5,410,505 | 4/1995 | Furuyama | 365/149 |
| 5,418,750 | 5/1995 | Shiratake et al. | 365/149 |
| 5,432,733 | 7/1995 | Furuyama | 365/149 |
| 5,444,652 | 8/1995 | Furuyama | 365/149 |
| 5,463,577 | 10/1995 | Oowaki et al. | 365/149 |
| 5,500,815 | 3/1996 | Takase et al. | 365/149 |
| 5,525,820 | 6/1996 | Furuyama | 365/149 |
| 5,537,347 | 7/1996 | Shiratake et al. | 365/149 |
| 5,567,963 | 10/1996 | Rao | 365/149 |
| 5,625,602 | 4/1997 | Hasegawa et al. | 365/149 |

FOREIGN PATENT DOCUMENTS 5-54633  3/1993  Japan .

OTHER PUBLICATIONS

"Digest of Technical Papers", *1989 IEEE International Solid-State Circuits Conference*, pp. 248–249; 114–115 and 299.

T. Saeki et al., "A Study of Close Packed Folded Bit–Line Cell Array (CPF) and Three Phase Folded Bit–Line Array/Circuit (TPF) for DRAM's", 1991, pp. 5–256.

*Primary Examiner*—A. Zarabian
*Attorney, Agent, or Firm*—Young & Thompson

[57] ABSTRACT

A semiconductor memory such as a dynamic random access memory (DRAM) has its memory cells designed to offset the effects of parasitic capacitance along the bit lines. In one embodiment, the bit storage capacitors of one group of memory cells has a capacitance value that is selected to be different from the capacitance value of the bit storage capacitors in a second group of memory cells. In a preferred embodiment, the capacitance value of a given bit storage capacitor is selected as a function of the distance of the associated memory cell from the sense amplifier, as measured along the bit line.

7 Claims, 7 Drawing Sheets

1

SEMICONDUCTOR MEMORY DEVICE HAVING MEMORY CELLS DESIGNED TO OFFSET BIT LINE PARASITIC CAPACITANCE

BACKGROUND OF THE INVENTION

1. Field of the Invention

The present invention relates to a semiconductor memory device, and more particularly to a semiconductor device having memory cells designed to offset parasitic capacitance along the bit lines.

2. Description of the Related Art

Recently, the dynamic random access memory (DRAM) has found widespread use as a large capacity memory device. However, such memory devices have long bit lines, and therefore their power consumption is relatively high. To solve this problem, a semiconductor memory was proposed in Japanese Paid Laid-Open Hei 5-54633. This semiconductor memory is a DRAM using one MIS (metal insulator semiconductor) transistor and one capacitor, and a schematic diagram of this semiconductor memory is shown in FIG. 6.

This semiconductor memory includes a plurality of memory cells 611–618 which are arranged in the form of a matrix having rows and columns, a plurality of word lines 621–624 for allowing the plurality of memory cells 611–618 to be selected one column at a time, and cell arrays 661 and 662 containing the plurality of memory cells 611–618 and including a plurality of bit lines 631–634 for transmitting data of the memory cells 611–618 which are selected by the word lines 621–624. Respective pairs of bit lines 631 and 632, and 633 and 634 are connected to sense amplifiers 641 and 642, respectively. The word lines 621–624 are connected to word line decoder 65 and are also connected to respective memory cells 611–618. The elements of word line decoder 65 are connected to an address line 68. The sense amplifiers 641 and 642 and the word line decoder 65 are disposed in peripheral regions of the cell arrays 661 and 662.

This memory device has a switch circuit 67 having a plurality of metal oxide semiconductor (MOS) transistors. The switch circuit 67 is provided between memory cell arrays 661 and 662 for reducing the charge and discharge current flowing in the bit lines 631–634. The switch circuit 67 connected to the bit lines 633 and 634, which are in turn connected to the sense amplifier 642 at the right side of the cell array 662, are connected to a signal line 67a, whereas the switch circuit 67 connected to the bit lines 631 and 632, which are connected in turn to the sense amplifier 641 at the left side of the cell array 661, are connected to a signal line 67b. When one of word lines 623 and 624 is selected by word line decoder 65, a control circuit 69 renders MOS transistors 671 and 672 in the switch circuit 67 non-conductive. Furthermore, when one of word lines 621 and 622 is selected by the word line decoder 65, a control circuit 69 renders MOS transistors 673 and 674 in the switch circuit 67 non-conductive. Hence, the charge and discharge current flowing in the bit lines 631–634 in such case is approximately ¾ of that if MOS transistors 671–674 were absent.

The memory cell arrays 661 and 662, as shown in FIG. 7, are constituted with a conventional layout. This shows, as one example, the layout of a stacked cell that forms capacitors on the bit lines 631–634. These cells are so arranged that the word lines 621–624 and the bit lines 631–634 are orthogonal to each other, and stacked capacitors 74 of the same size are disposed on capacitor contacts 75. Each source-drain region 73 is connected to a stacked capacitor 74 by contacts 75 and bit lines 631–634 are connected by

2 contacts 72. Thus, all of the memory cells have the same structure, and all of the capacitors have the same capacitance as each other.

The above-mentioned conventional semiconductor memory has reduced parasitic capacitance along bit lines 631–634 when one of memory cells 613, 614, 615 and 616 is selected by the word line decoder 65, because each bit line is divided into two lines by the control circuit 69. As a result, a response time to access memory cells 613, 614, 615 and 616 increases. However, when one of memory cells 611, 612, 617 and 618 is selected by the word line decoder 65, the control circuit 69 does not divider the associated bit line 631–634 into two lines. As a result, in this case, a response time does not increase. Therefore, a plurality of response times exist in this conventional memory device. As a countermeasure, the operation timing of the sense amplifiers 641, 642 must be changed in accordance with the signal difference, which leads to a complicated circuit. Also, because the minimum value of the read signal is equal to that in the case where the bit lines 631–634 are not divided, the minimum value of the cell capacitance must also be equal to that in the case where the bit lines 631–634 are not divided into a plurality of lines.

SUMMARY OF THE INVENTION

An object of the present invention is, therefore, to provide a semiconductor memory device which is able to access all of its memory cells with the same response time.

To achieve the above object, the semiconductor device of the present invention comprises a bit line, a first memory cell connected to the bit line, the first memory cell having a first capacitor for storing data, the first capacitor having a first capacitance, and a second memory cell connected to the bit line, the second memory cell having a second capacitor for storing data, the second capacitor having a second capacitance, and the first capacitance differing from the second capacitance. Therefore, an access time for accessing the first memory cell can be made equal to an access time for accessing the second memory cell because the first capacitance differs by a predetermined amount from the second capacitance.

BRIEF DESCRIPTION OF THE DRAWINGS

The above and other objects and features of the present invention will be more apparent from the following description taken in conjunction with the accompanying drawings, in which.

DETAILED DESCRIPTION OF THE PREFERRED EMBODIMENTS

Figure 1:
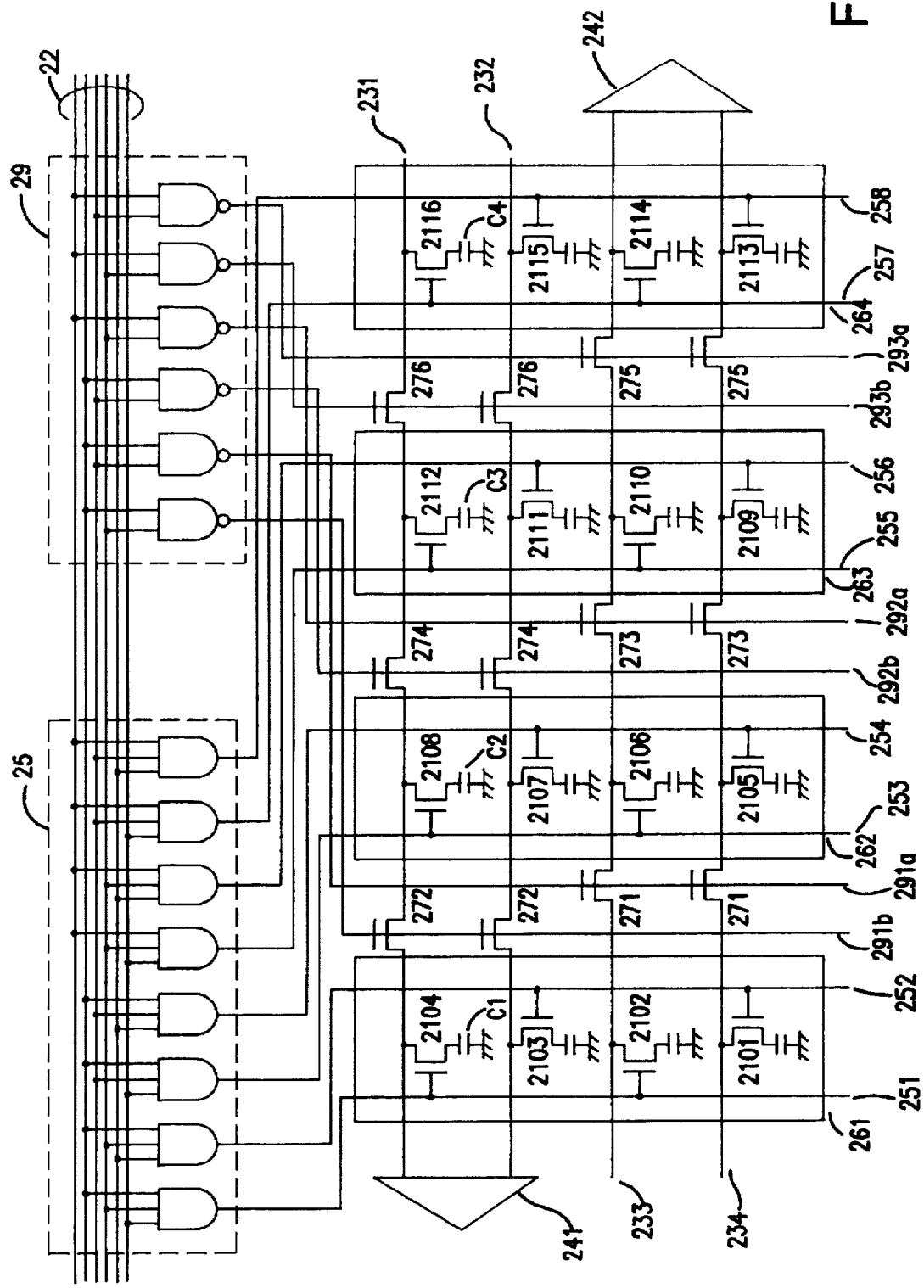
FIG. 1 is a schematic diagram showing a semiconductor memory in accordance with a first embodiment of the present invention.

The semiconductor memory shown in FIG. 1 includes a plurality of memory cells 2101–2116 which are arranged in the form of a matrix having rows and columns, a plurality of word lines 251–258 for selecting a column of memory cells 2101–2116 based on a word line decoder 25, and memory cell arrays 261–264 each containing a column of memory cells 2101–2116 and including a plurality of bit lines 231–234 for transmitting data of the memory cells 2101–2116 which are selected by the word line decoder 25. A pair of bit lines 231, 232 and 233, 234 are connected to sense amplifiers 241 and 242, respectively. The word line decoder 25 is connected to an address line 22 and to all word lines 251–258. The sense amplifiers 241 and 242 and the word line decoder 25 are disposed at peripheral regions of the cell arrays 261–264. The sense amplifiers 241 and 242 are alternately arranged on the left side of the memory cell array 261 and the right side of the memory cell arrays 264, respectively.

A plurality of MOS transistors 271 and 272, 273 and 274, and 275 and 276 are provided between the memory cell arrays 261 and 262, the memory cell arrays 262 and 263, and the memory cell arrays 263 and 264, respectively, for reducing the charge and discharge current flowing in the bit lines 231–234. Each of the bit lines 231–234 is equally divided into four lines by MOS transistors 271–276. Each of the MOS transistors 271, 273 and 275 is connected to an associated signal line 291a, 292a and 293a, respectively, and each of the MOS transistors 272, 274 and 276 is connected to an associated signal line 291b, 292b and 293b, respectively, When a given word line 251–258 is selected by the word line decoder 25, those MOS transistors 271–276 disposed adjacent each memory cell and on the opposite side from its associated sense amplifier are rendered non-conductive. For example, when memory cell 2114 is selected by the word line decoder 25, the MOS transistor 275 connected to the signal line 293a is rendered non-conductive to reduce the operative length of the bit line 233 to a quarter of its total length. Hence, the charge and discharge current is approximately ⅝ times of that in the case without MOS transistor 275.

Each of memory cells 2101–2116 comprises one MOS transistor and one capacitor, and each of the capacitors has a different capacitance as a function of the parasitic capacitance along bit lines 231–234, For example, the memory cell 2104 has the smallest capacitor C1, because the parasitic capacitance of bit line 231 is smallest when MOS transistor 272 is rendered non-conductive and memory cell 2104 is selected by the word line decoder 25, The memory cell 2108 has a bigger capacitor C2 than the capacitor C1 of the memory cell 2104, because the parasitic capacitance of bit line 231 becomes bigger when MOS transistor 274 is rendered non-conductive and memory cell 2108 is selected by the word line decoder 25. Similarly, the memory cell 2112 has a bigger capacitor C3 than the capacitor C2, and the memory cell 2116 has the biggest capacitor C4. When the parasitic capacitance of bit line is smallest, the smallest capacitor C1 slowly charges or discharges the bit line, and when the parasitic capacitance of bit line is bigger or biggest, the bigger or biggest capacitors C2, C3 or C4 rapidly charges or discharges the bit line. As a result, the access time for reading out data from the various memory cells 2104, 2108, 2112 and 2116 can be made the same. Thus, the cell capacitor preferably has its capacitance set in proportion to the parasitic bit line capacitance, as C1:C2:C3:C4=PCL1:PCL2:PCL3:PCL4. Each of PCL2, PCL2, PCL3 and PCL4 indicate parasitic capacitance of the bit line 231 when the transistors 272 are non-conductive, the transistors 274 are nonconductive, the transistors 276 are non-conductive and all of transistors 272, 274 and 276 are conductive, respectively.

Figure 2A:
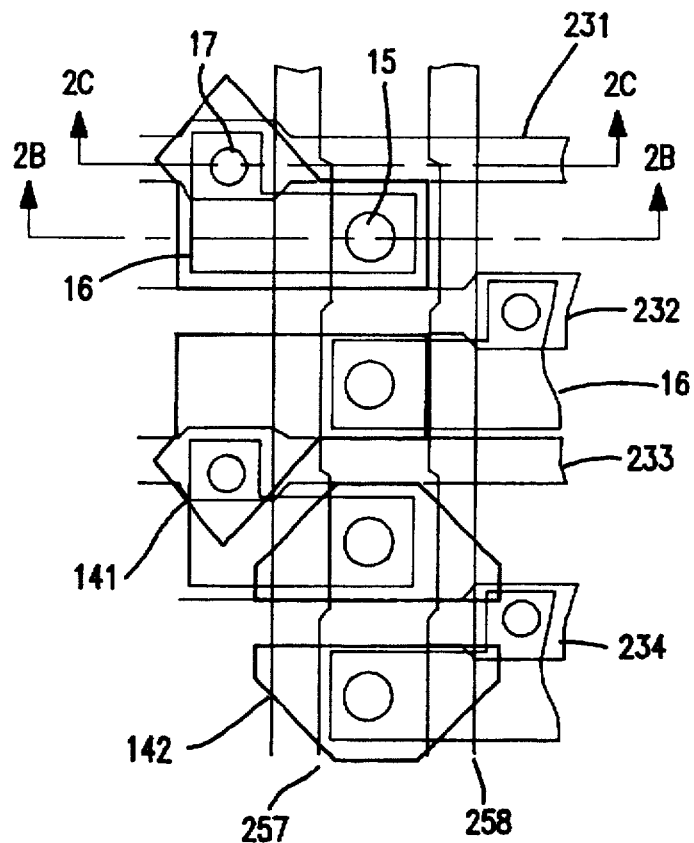
FIG. 2(A) is a diagram showing the layout of memory cells used in the semiconductor memory shown in FIG. 1.
Figure 2B:
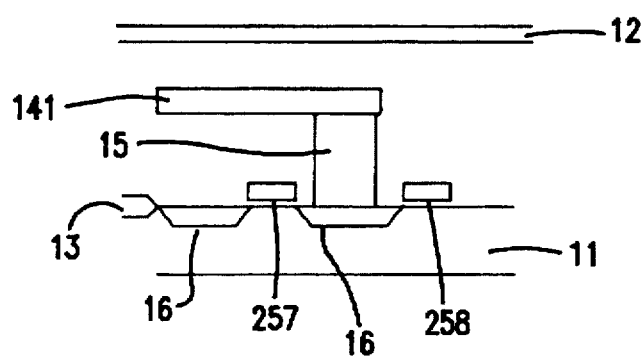
FIGS. 2(B) and 2(C) are cross sectional views of the structure shown in FIG. 2(A)
Figure 2C:
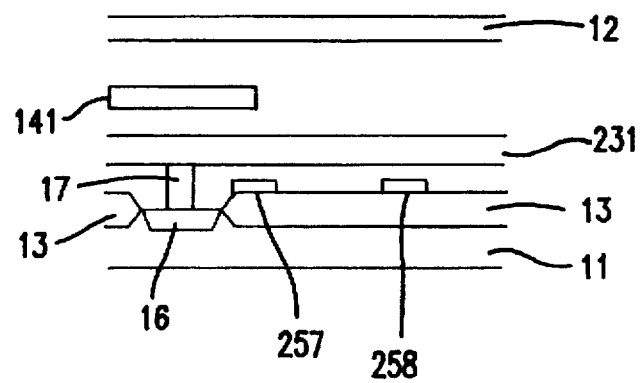

FIG. 2(A) shows the layout of the memory cells used in the semiconductor memory shown in FIG. 1. The structure of the memory cell is of the stacked cell type in which capacitors 141 and 142 are formed on bit lines 231–234 The memory cell is so constituted that the word lines 257 and 258 are orthogonal to the bit lines 231–234, and stacked capacitors 141 and 142 of a size proportional to the capacitance of the bit lines are disposed on capacitor contacts 15. Each source-drain region 16 is connected to stacked capacitors 141 and 142 by the capacitor contacts 15 and bit lines 231–234 by contacts 17. FIG. 2(B) and 2(C) show a cross sectional view taken along line a–a' and b–b' of FIG. 2(A). These figures show the memory cell array 264 in which the source-drain region is formed on a semiconductor substrate 11, a field insulator is formed on a semiconductor substrate 11, each of the word lines 257 and 258 is formed on a semiconductor substrate 11 via gate insulator (not shown in FIG. 2(B)), and the stacked capacitor 141 is formed above the word line 257 and the bit line 231 and connected to the source-drain region via the capacitor contact 15, with a capacitance established between a counter electrode 12 and the stacked capacitor 141.

Figure 3:
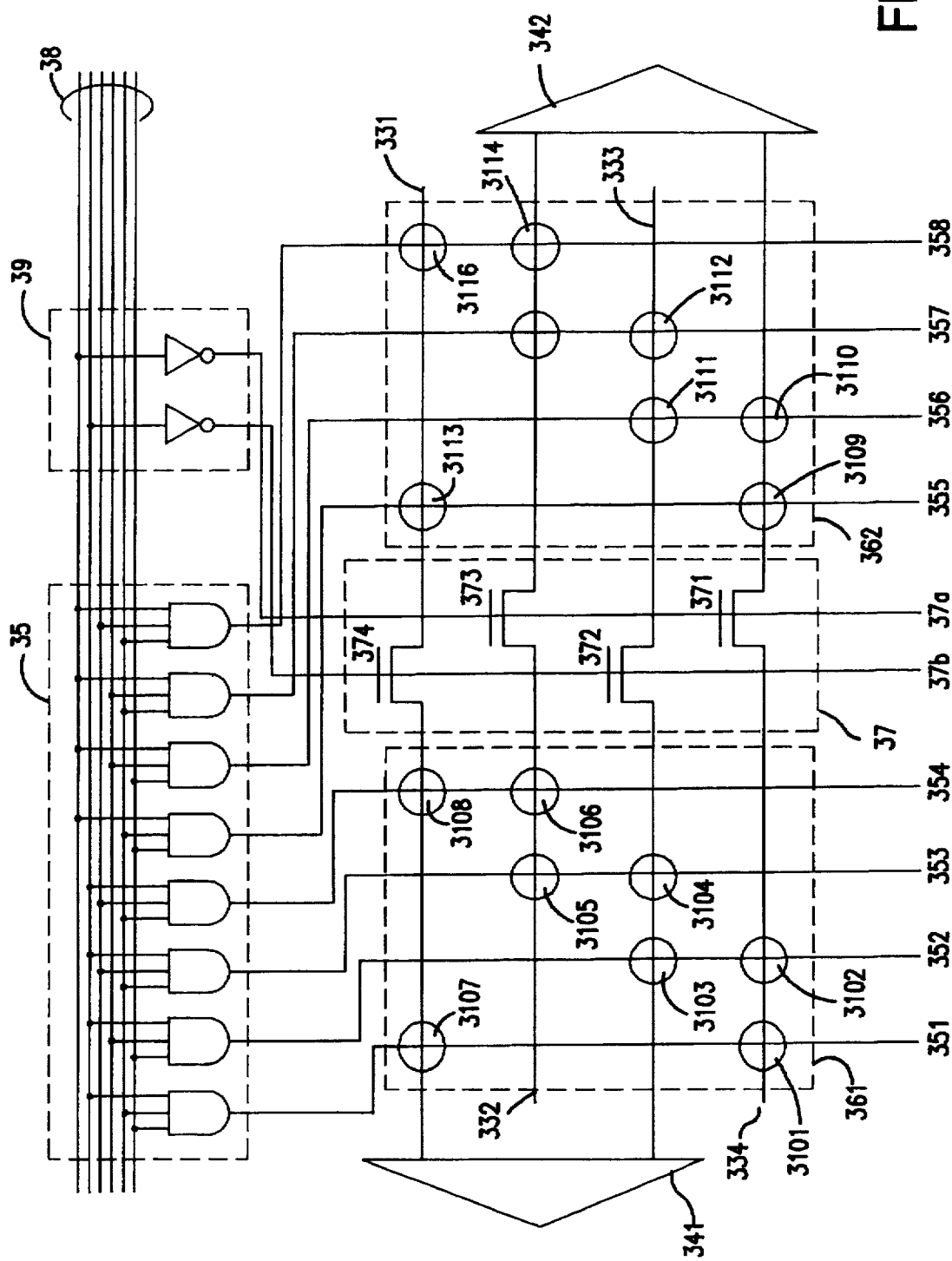
FIG. 3 is a schematic diagram showing a semiconductor memory in accordance with a second embodiment of the present invention.

FIG. 3 is a schematic diagram showing a semiconductor memory in accordance with a second embodiment of the present invention. This semiconductor memory includes a plurality of memory cells 3101–3116 which are arranged in the form of a matrix having rows and columns, a plurality of word lines 351–358 for selecting a column of memory cells 3101–3116, and cell arrays 361 and 362 containing a plurality of memory cells 3101–3116 and including a plurality of bit lines 331–334 for transmitting data of the memory cells 3101–3116 which are selected by a word line decoder 35. A pair of bit lines 331 and 333, and 332 and 334 are connected to sense amplifiers 341 and 342, respectively. The word lines 351–358 are connected to the word line decoder 35, and the word line decoder 35 is connected to an address line 38. The sense amplifiers 341 and 342 and the word line decoder 35 are disposed at peripheral regions of the cell arrays 361 and 362. The sense amplifiers 341 and 342 are alternately arranged on the left and right sides of the cell arrays 361 and 362, respectively. The bit lines 331 and 333 are connected to the left sense amplifier 34a and the bit lines 332 and 334 are connected to the right sense amplifier 342, and the memory cells 3101–3116 are disposed diagonally (refer to 1989 ISSCC, pp. 248–249, "A 45ns 16Mb DRAM with Triple-Well Structure").

In this embodiment, also, a switch circuit 37 provided between the memory cell arrays 361 and 362 reduces the charge and discharge current flowing in the bit lines 331–334. Each of the bit lines 331–334 is divided into two lines by the switch circuit 37.

Figure 4A:
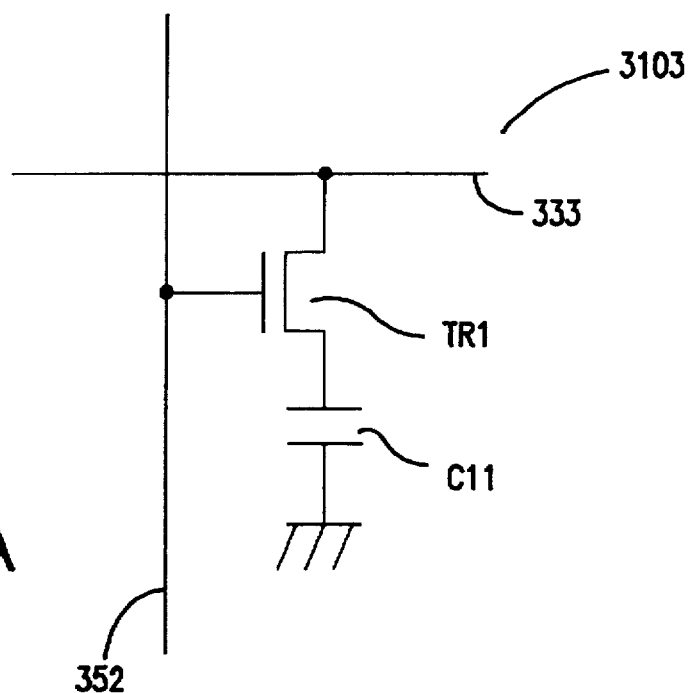
FIGS. 4(A) and 4(B) are circuit diagrams of each of the two types of memory cells shown in FIG. 3.
Figure 4B:
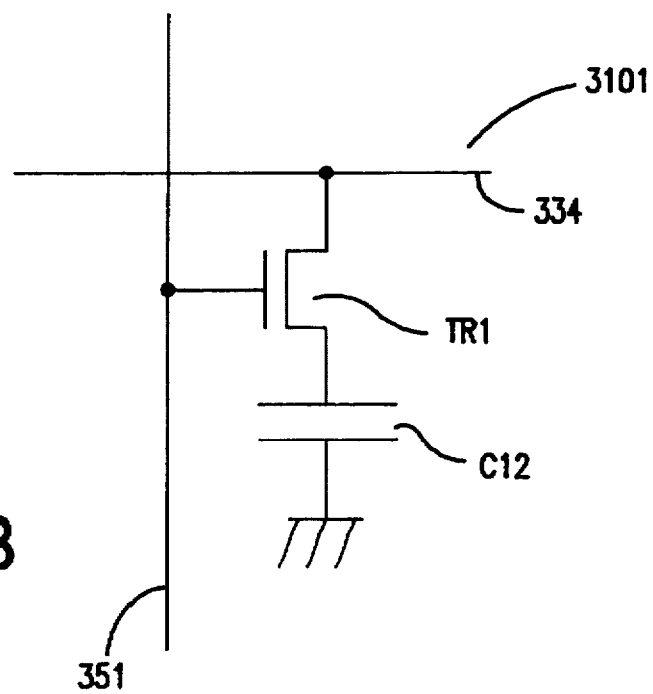

FIGS. 4(A) and 4(B) show the structure of each of the memory cells shown in FIG. 3. Memory cells 3101, 3102, 3105, 3106, 3111, 3112, 3115 and 3116 have a structure as shown in FIG. 4(B), so that each of those memory cells charges a whole bit line 331–334. Therefore, each of those memory cells has one transistor TR1 and a larger capacitor C12 for rapidly charging the bit lines 331–334. Memory cells 3103, 3104, 3107, 3108, 3109, 3110, 3113 and 3114 have a structure as shown in FIG. 4(A), so that each of those memory cells charges half of a bit line 331-334. Therefore, each of those memory cells has one transistor TR1 and a smaller capacitor C11 for slowly charging the bit lines 331-334.

Figure 5A:
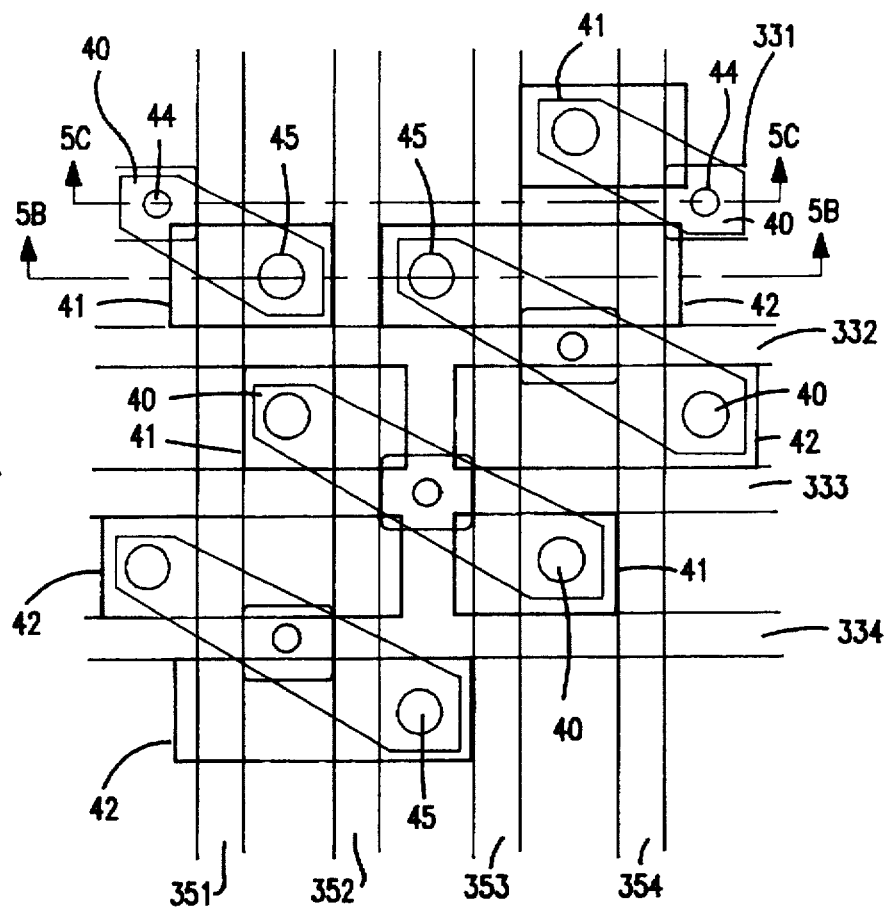
FIG. 5(A) is a diagram showing the layout of memory cells used in the semiconductor memory shown in FIG. 3.

FIG. 5(A) is a diagram showing the layout of memory cell array 361 used in the semiconductor memory shown in FIG. 3. The structure of the memory cell is of the stacked cell type in which capacitors are formed above bit lines 331-334, as in the case of FIG. 2(A). Word lines 351-354 and bit lines 331-334 are orthogonal to each other, and stacked capacitors C11 and C12 of a size proportional to the associated capacitance of the bit lines is disposed on capacitor contacts 45. In this example, because the bit lines 331-334 are alternately disposed and the memory cells are disposed diagonally, capacitors having a large area and capacitors having a small area are arrayed in the direction of the bit lines. As a result, even though the area is charged, a rectangular shape can be kept (refer to "1991 Electronic Information Communication Learned Society Spring Season National Convention, Paper No. C-665).

Figure 5B:
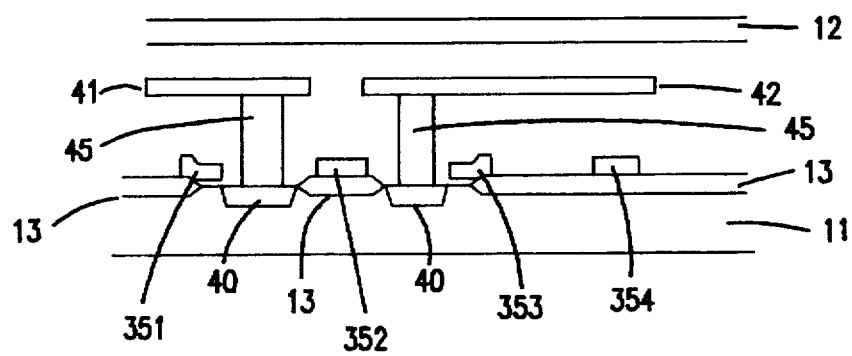
FIGS. 5(B) and 5(C) are cross sectional views of the structure shown in FIG. 5(A)
Figure 5C:
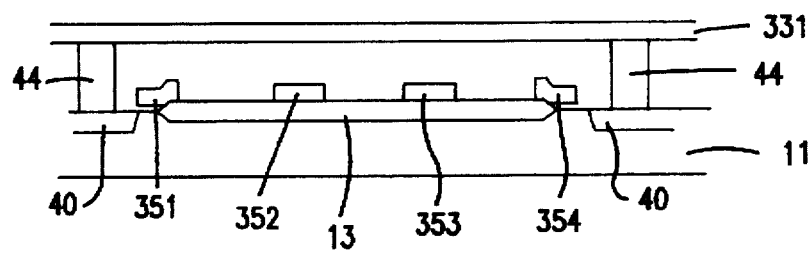
Figure 6:
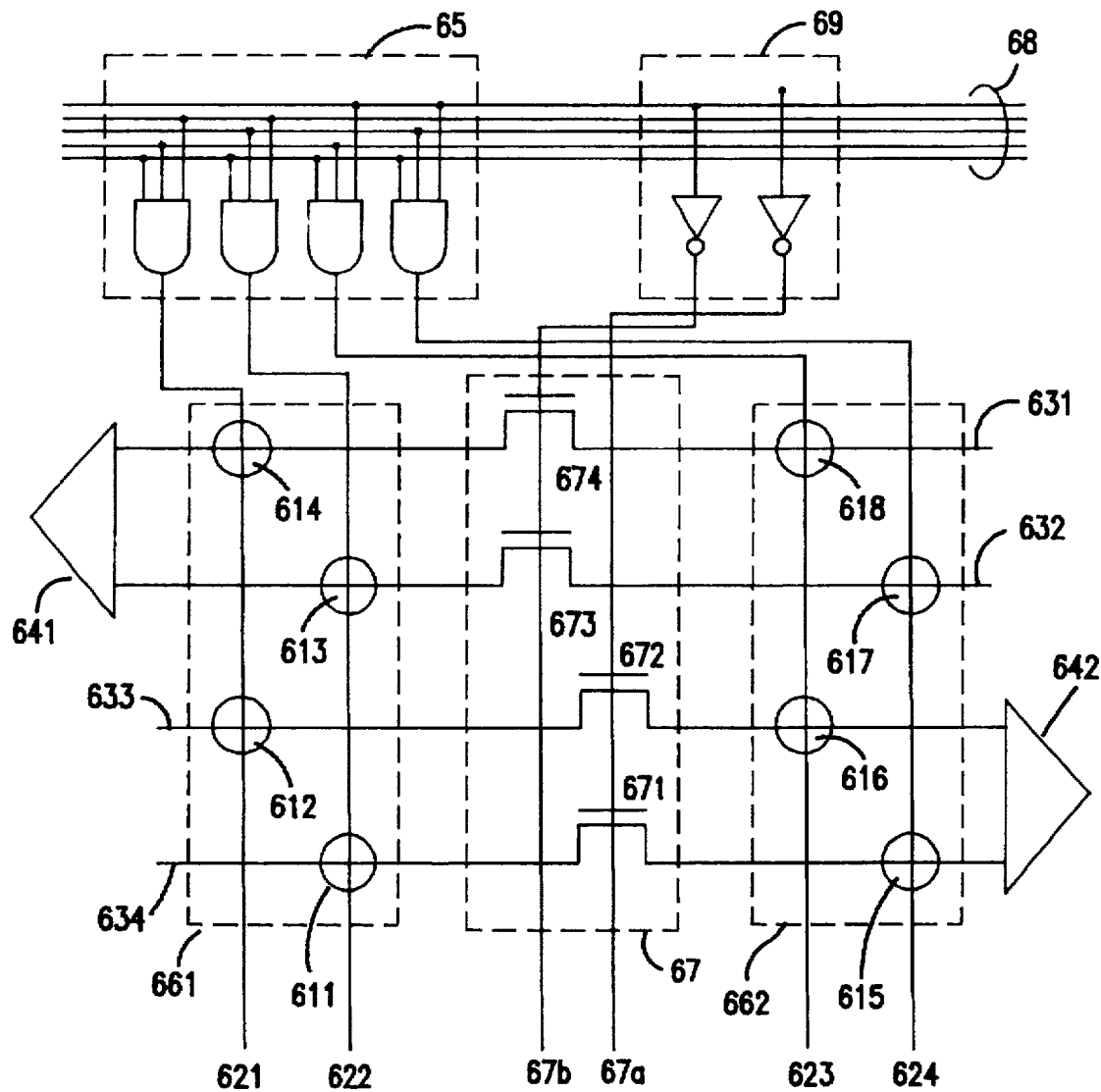
FIG. 6 is a schematic diagram showing a conventional semiconductor memory.
Figure 7:
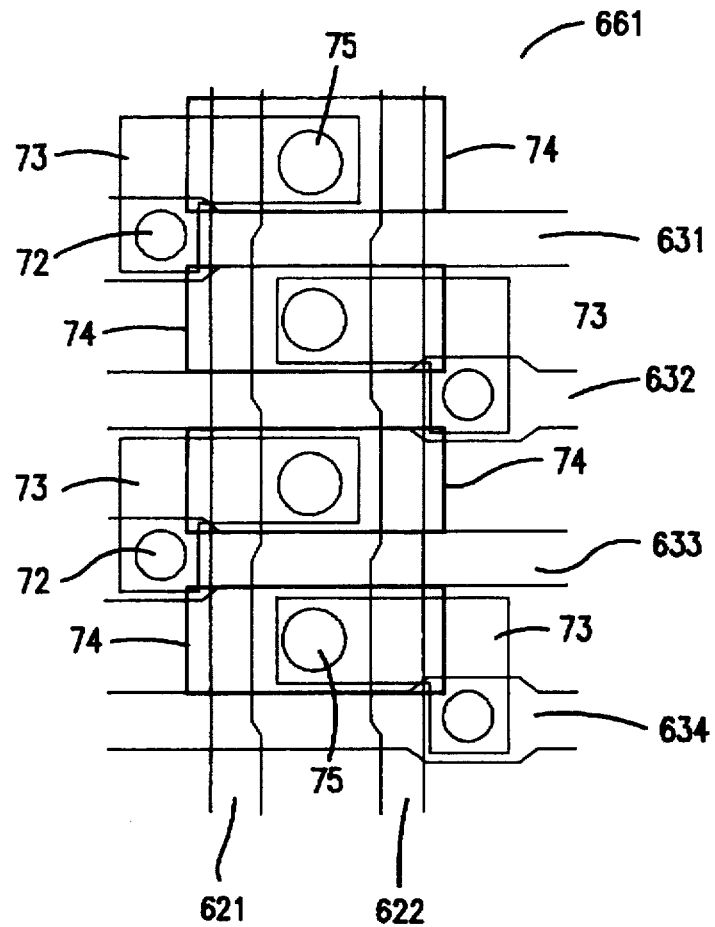
FIG. 7 is a diagram showing the layout of memory cells used in the conventional semiconductor memory shown in FIG. 6.

FIGS. 5(B) and 5(C) are cross sectional views taken along line a-a' and b-b' of FIG. 5(A). These figures show the memory cell array 361 in which the source-drain region 40 is formed on a semiconductor substrate 11 and connected to the bit line 331 via contact 44, a field insulator 13 is formed on a semiconductor substrate 11, each of the word lines 351-354 is formed on a semiconductor substrate 11 via gate insulator (not shown in FIG. 5(B)) or directly, and the stacked capacitors 41 and 42 are formed above the word line 351-354 and the bit line 331 and connected to the source-drain region 40 via the capacitor contact 45, with a capacitance established between the counter electrode 12 and the stacked capacitors 41 and 42.

As was described above, according to the present invention, contrary to the conventional cell array in which the cell amplifiers are alternately disposed and a bit line is divided into a plurality of lines through MOS transistors, the following advantages are obtained:

1. Since the cell capacitor has a capacitance set in proportion to the parasitic bit line capacitance, all the signals from the cells become equal to each other. As a result, the adjustment of the sense timing is not required, which allows simplifying the circuit.

2. In the case where one bit line is divided into m line segments, all read signals are {(½ m) (m+1)Cbb+Cbs}/(Cbb+Cbs) times as large as when the bit line is undivided, by the equal-capacitor manufacturing method, thereby facilitating the method of manufacturing a cell capacitor, Here,
Cbb=the component of bit line capacitance contributed by the bit line, and
Cbs=the component of bit line capacitance contributed by the sense amplifier, It should be noted that the structure of the memory cell may be of the stacked cell type in which capacitors may be disposed on bit lines, of the stacked cell type in which capacitors may be disposed below the bit lines, of the trench cell type in which capacitors are formed in holes which are defined in a semiconductor substrate, or of the planar cell type in which capacitors are formed on the surface of the semiconductor substrate.

The foregoing description of various preferred embodiments of the invention has been presented solely for purposes of illustration and description. It is not intended to be exhaustive or to limit the invention to the precise forms disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

I claim:

1. A semiconductor device including:
   first and second bit lines;
   a sense amplifier including an input node coupled to said first bit line;
   a switch circuit connected between said first and second bit lines;
   a first memory cell connected to said first bit line, said first memory cell including a first transistor connected between said first bit line and a first node and a first storage element connected between said first node and a reference potential line;
   a second memory cell connected to said second bit line, said second memory cell including a second transistor connected between said second bit line and a second node and a second storage element connected between said second node and said reference potential line; and
   a control circuit operable in a first state to render said first transistor conductive and to render said switch circuit and said second transistor non-conductive and in a second state to render said second transistor and said switch circuit conductive and to render said first transistor non-conductive;
   said first storage element having a storage capacity different from said second storage element such that a first access time for accessing said first memory cell is substantially equal to a second access time for accessing said second memory cell.

2. The semiconductor device as claimed in claim 1, wherein said first and second access times are times for reading out data from said first memory cell and said second memory cell.

3. The semiconductor device as claimed in claim 1, wherein each of said first and second storage elements comprise a capacitor.

4. A semiconductor device including:
   first and second bit lines;
   a switch circuit connected between said first and second bit lines;
   a sense amplifier connected to said first bit line, and connected to said second bit line via said switch circuit and said first bit line;
   a first memory cell connected to said first bit line, said first memory cell including a first transistor connected between said first bit line and a first node and a first capacitor having a first capacitance connected between said first node and a reference potential line;
   a second memory cell connected to said second bit line, said second memory cell including a second transistor connected between said second bit line and a second node and a second capacitor having a second capacitance connected between said second node and said reference potential line; and
   a control circuit operable in a first state to render said first transistor conductive and to render said switch circuit and said second transistor non-conductive and in a second state to render said second transistor and said switch circuit conductive and to render said first transistor non-conductive;

said first capacitance being smaller than said second capacitance.

5. The semiconductor device as claimed in claim 4 wherein a ratio of said first capacitance to said second capacitance is equal to a ratio of a first parasitic capacitance of said first bit line to a second parasitic capacitance of said first bit line and said second bit line.

6. A semiconductor device comprising:

a bit line;

a sense amplifier connected to said bit line;

a first memory cell connected to said bit line at a first distance from said sense amplifier, said first memory cell including a first transistor connected between said first bit line and a first node and a first capacitor having a first capacitance connected between said first node and a reference potential line; and a second memory cell connected to said bit line at a second distance from said sense amplifier that is larger than said first distance, said second memory cell including a second transistor connected between said second bit line and a second node and a second capacitor having a second capacitance connected between said second node and said reference potential line;

said first transistor being rendered conductive and said second transistor being rendered non-conductive in a first state, said second transistor being rendered conductive and said first transistor being rendered non-conductive in a second state, and said second capacitance being larger than said first capacitance.

7. The semiconductor device as claimed in claim 6, further comprising a third memory cell connected to said bit line, at a third distance from said sense amplifier longer than said second distance, said third memory cell having a third capacitor for storing data, said third capacitor having a third capacitance that is larger than said second capacitance.

* * * * *